(12) United States Patent
Vengertsev et al.

(10) Patent No.: US 8,677,288 B2
(45) Date of Patent: Mar. 18, 2014

(54) TEST PATTERN SELECTION METHOD FOR OPC MODEL CALIBRATION

(75) Inventors: Dmitry Vengertsev, Hwaseong-si (KR); Seong-Ho Moon, Yongin-si (KR); Artem Shamsuarov, Suwon-si (KR); Seung-Hune Yang, Seoul (KR); Moon-Gyu Jeong, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/594,492

(22) Filed: Aug. 24, 2012

(65) Prior Publication Data

US 2013/0175240 A1    Jul. 11, 2013

(30) Foreign Application Priority Data

Jan. 10, 2012 (KR) ......................... 10-2012-0003036

(51) Int. Cl.
 *G06F 17/50* (2006.01)
(52) U.S. Cl.
 USPC .............................. 716/53; 716/50
(58) Field of Classification Search
 None
 See application file for complete search history.

(56) References Cited

U.S. PATENT DOCUMENTS

| | | | |
|---|---|---|---|
| 7,418,694 B2 | 8/2008 | Kobayashi et al. | |
| 2008/0068667 A1 | 3/2008 | Tejnil | |
| 2009/0123057 A1* | 5/2009 | Mukherjee et al. | 382/144 |
| 2010/0122225 A1* | 5/2010 | Cao et al. | 716/4 |

FOREIGN PATENT DOCUMENTS

JP    2007-156027    6/2007

OTHER PUBLICATIONS

Viehoever et al., "Pattern selection in high-dimensional parameter spaces," Optical Microlithography XXV, 2012 Proc. of SPIE, vol. 8326, 12 pages.*
Abdo et al., "The feasability of using image parameters for test pattern selection during OPC model calibration," Optical Microlithography XXIII, 2010 Proc. of SPIE, vol. 7640, 11 pages.*
Al-Imam, "Design Driven Test Patterns for OPC Models Calibration," Optical Microlithography XXII, 2009 Proc. of SPIE, vol. 7274, 9 pages.*
Ding et al., "K-means Clustering via Principal Component Analysis," 2004 Proc. of the $21^{st}$ Int'l Conference on Machine Learning, 8 pages.*
Ng et al., "Clarans: A Method for Clustering Objects for Spatial Data Mining," IEEE Trans. on Knowledge and Data Engineering, vol. 14, No. 5, Sep./Oct. 2002, pp. 1003-1016.*
Oberschmidt et al., "Automation of Sample Plan Creation for Process Model Calibration," Optical Microlithography XXIII, 2010 Proc. of SPIE, vol. 7640, 9 pages.*
Roessler et al., "Improvement of empirical OPC Model Robustness using Full-Chip Aerial Image Analysis," 2003 Proc. of SPIE, vol. 5256, $23^{rd}$ Annual BACUS Symposium of Photomask Technology, pp. 222-229.*

* cited by examiner

*Primary Examiner* — Leigh Garbowski
(74) *Attorney, Agent, or Firm* — Volentine & Whitt, PLLC

(57) ABSTRACT

A block management method for OPC model calibration includes calculating differences in several different optical functions between first patterns of a first mask and patterns of a second mask corresponding to the first patterns but differing therefrom by a predetermined bias, selecting one or more of the optical functions based on the calculated differences, clustering data of variations in the values of the calculated differences in the selected ones of the optical functions, selecting respective ones of the first patterns in consideration of how the data clusters, and designating the selected first patterns as test patterns.

18 Claims, 8 Drawing Sheets

$M2 = M1 + \triangle M$

TEST PATTERN SELECTION METHOD FOR OPC MODEL CALIBRATION

PRIORITY STATEMENT

This application claims priority from Korean Patent Application No. 10-2012-0003036 filed on Jan. 10, 2012 in the Korean Intellectual Property Office, and all the benefits accruing therefrom under 35 U.S.C. 119, the contents of which are hereby incorporated by reference in their entirety.

BACKGROUND

1. Field of the Inventive Concept

The present inventive concept relates to lithography. More particularly, the inventive concept relates to optical proximity correction (OPC) of masks used in photolithographic processes.

2. Description of the Related Art

Photolithography is a process by which patterns, e.g., circuit patterns, are transcribed onto a substrate such as a semiconductor wafer. In general, in photolithography, a photosensitive film (photoresist) is formed on the wafer, the photoresist is exposed to an image of patterns of a mask (e.g., a photomask), and the photoresist is developed to remove the exposed or unexposed portions thereof. Then, the resulting photoresist pattern is used as a mask to etch a target layer under the photoresist pattern and thereby form the circuit patterns.

The mask pattern and exposure conditions of the photolithography process must be designed such that the circuit patterns formed on the wafer bear a precise resemblance to the designed layout of the circuit patterns. However, the circuit patterns formed on the wafer may differ from their designed layout due to diffraction of the exposure light transmitted from certain regions of the mask where the mask patterns are complex or from regions of the mask where the size and line width, for example, of adjacent mask patterns have large differences. One technique used to obviate this problem is optical proximity correction (OPC). OPC is a predictive modeling technique in which a region of a mask having patterns whose image will not be transferred to the wafer precisely as desired will be predicted after designing the mask, and the shape of those mask patterns is altered, in their final design, based on the OPC model to compensate for differences between the design layout of the circuit patterns and the circuit patterns otherwise produced using the unaltered mask patterns.

SUMMARY

According to an aspect of the inventive concept, there is provided a test pattern selection method for OPC model calibration, which includes quantifying optical functions of a first mask having mask patterns, quantifying the same optical functions of a second mask having mask patterns that only differ from the mask patterns of the first mask by a predetermined bias, and calculating the differences between the optical functions, respectively, of the first and second masks, then selecting certain ones of the optical functions, from among those quantified, based on the calculated differences in the optical functions, clustering data of the calculated differences in the optical functions for the selected optical functions, and selecting respective ones of the first patterns in consideration of how the data clusters, and designating the selected first patterns as test patterns.

According to another aspect of the inventive concept, there is provided a method of fabricating a photomask using an OPC model calibrated using a test pattern selection method in which patterns of a first mask (first mask patterns) are sampled in a manner similar to that described above. Specifically, several different optical functions of the first mask are quantified, the same optical functions of a second mask having mask patterns that correspond to those first mask patterns, respectively, but which differ from the first mask patterns by a predetermined bias are quantified, and the differences between the optical functions, respectively, of the first and second masks are calculated. In this respect, the quantifying of the optical functions of the first mask, the quantifying of the same optical functions of the second mask, and the calculating of the differences between the optical functions are preformed for each pair of corresponding patterns of the first and second masks. Then a sensitivity matrix that includes data of values of the calculated differences in optical function for each of the optical functions, is generated. As a result, the sensitivity matrix also contains data of variations among the values of the calculated differences for each of the optical functions. The sensitivity matrix is analyzed to select one or more optical functions from among the several different optical functions. Data pertaining to the selected optical functions is pulled from the sensitivity matrix and respective ones of the first patterns are selected in consideration of how the data clusters. The selected first patterns are designated as test patterns. Then, a layout of mask patterns of a photomask is altered or "transformed" according to the calibrated OPC model, and the mask patterns are fabricated according to the altered layout.

According to another aspect of the inventive concept, there is provided a test pattern selection method for OPC model calibration, which includes providing a first mask having a number of first patterns, and a second mask having a number of second patterns that are the same as the first patterns but altered by a predetermined bias, on a pattern by pattern basis with respect to the first and second patterns, quantifying differences in optical functions of the first and second masks, corresponding to changes that would occur in the optical functions if the first mask were changed to the second mask in a given photolithographic process, producing a sensitivity matrix of data representative of the differences in the optical functions, analyzing values of the data in the sensitivity matrix, using singular value decomposition (SVD), to select one or more of the optical functions from among those whose differences were quantified, generating data representing the selected optical functions using a clustering of large application (CLARA) process, and correlating the data generated using CLARA with respective ones of the first patterns and designating the respective ones of the first patterns as test selection patterns.

BRIEF DESCRIPTION OF THE DRAWINGS

The above and other aspects and features of the inventive concept will become more apparent from the following detailed description of the preferred embodiments thereof made with reference to the attached drawings, in which:

FIGS. 2 to 7 steps in the test pattern selection method for OPC model calibration in accordance with the inventive concept, wherein:

FIG. 2 is schematic plan view of a first mask,

FIG. 3 is a schematic plan view of a second mask,

FIG. 4 is a graph of the intensity of light transmitted by the first mask from a section of the first mask taken along line A-A' in FIG. 2, FIG. 5 is a graph of the intensity of light transmitted by the second mask from a section of the second mask taken along line B-B' in FIG. 3, FIG. 6 is a diagram of a sensitivity space in which data of optical function differences of important ones of the optical functions is plotted, and FIG. 7 is a simplified form of the sensitivity space;

DETAILED DESCRIPTION OF THE PREFERRED EMBODIMENTS

The inventive concept will be described more fully hereinafter with reference to the accompanying drawings. In some of the drawings, the number, sizes and relative sizes and shapes of patterns and layers shown in section may be simplified or exaggerated for clarity.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "mask pattern" may refer to a group of several geometric features spaced from each other, and which group may be repeated.

Hereinafter, a test pattern selection (sampling) method for OPC model calibration in accordance with an embodiment of the present invention will be described with reference to FIGS. 1 to 7.

Figure 1:
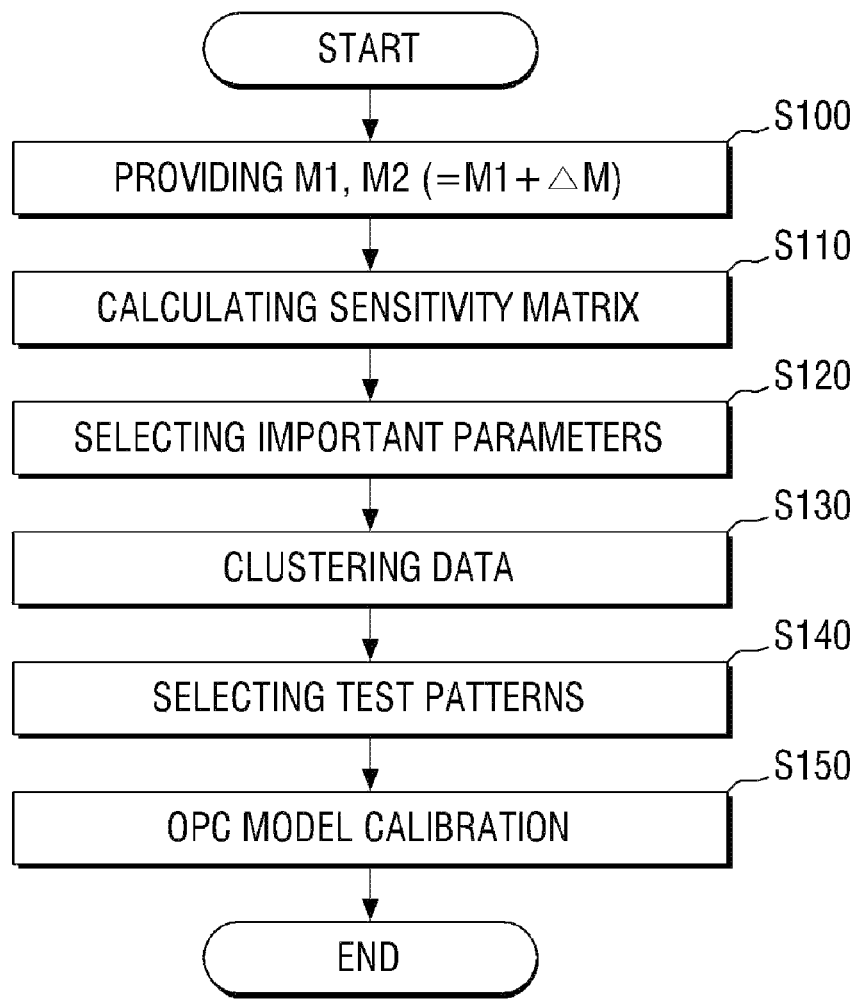
FIG. 1 is a flowchart of an embodiment of a test pattern selection method for OPC model calibration in accordance with the inventive concept.
Figure 2:
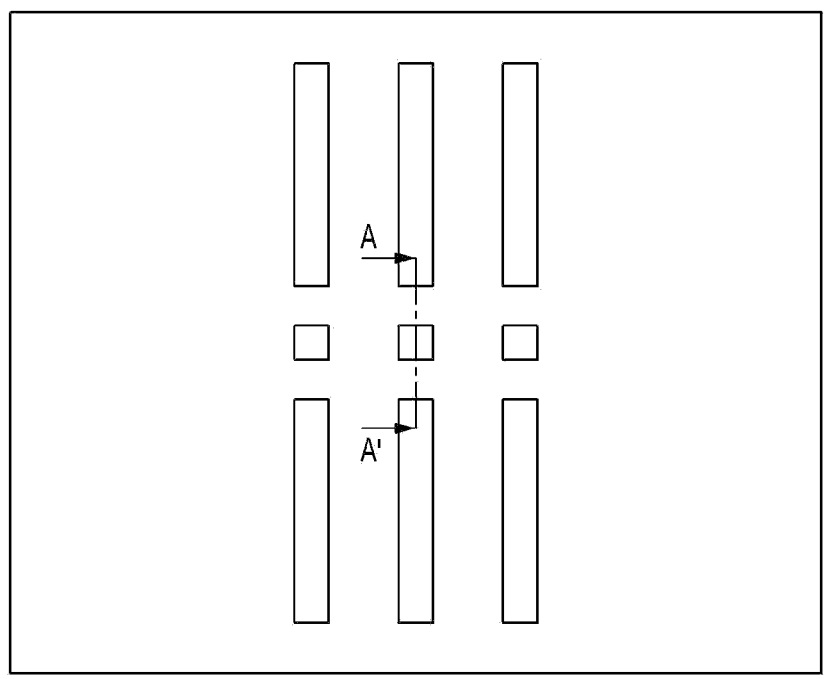
Figure 3:
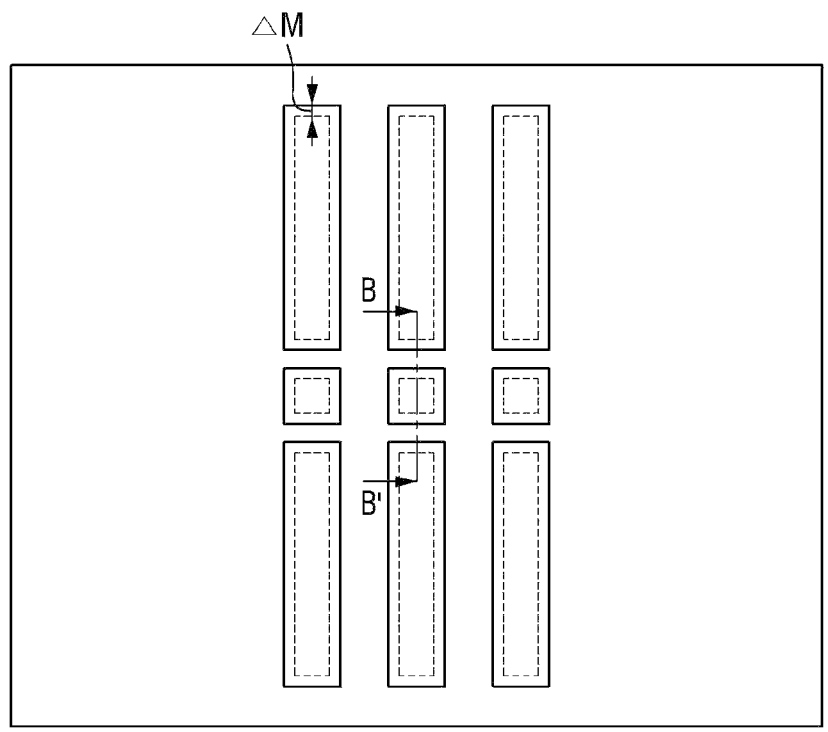

Referring to FIGS. 1 to 3, there are provided a first mask M1 including a number of patterns (first patterns) and a second mask M2 including a number of patterns different (second patterns) from the first patterns (step S100).

For simplicity, FIG. 2 illustrates the first mask M1 as having several first patterns. However, in actuality, the first mask M1 has millions or so of the first patterns. For example, the first mask M1 may be a spider mask having a number of test patterns on the order of several millions.

The patterns of the second mask M2 are the same as the patterns of the first mask M1 but altered by a predetermined bias ΔM. For example, referring to FIG. 3, the second patterns are equivalent to the first patterns of the first mask M1 expanded by a predetermined bias ΔM. However, the inventive concept is not so limited. For instance, the second patterns may be equivalent to the patterns of the first mask M1 contracted by the predetermined bias ΔM.

In other words, the patterns of the second mask M2 may be equivalent to any uniform alteration of the patterns of the first mask M1.

Also, for simplicity, FIG. 3 illustrates only several second patterns of the second mask M2. However, in practice, the second mask M2, like the first mask M1, has a number of patterns on the order of several millions.

Next, a sensitivity matrix is generated (step S110). The sensitivity matrix is a matrix of data of differences in optical functions between the first mask M1 and the second mask M2 on a pattern by pattern basis. Optical function basically refers to results of a photolithographic process dependent on the geometry of the mask pattern. Therefore, the sensitivity matrix is a matrix of differences in outcome between using the first mask M1 in a photolithographic process and the second mask M2 in the same photolithographic process (i.e., under the same process parameters).

In this regard, optical results of a photolithography process will change as the geometry of the mask patterns change, in this case by the predetermined geometrical bias ΔM. Examples of the optical results dependent on characteristics of the mask pattern, i.e., examples of the optical functions, are the critical dimension (CD) of the pattern formed as a result of the photolithography process, the contrast of the image transmitted by the mask (onto some focal plane which in practice is within the photoresist), the slope of the sidewalls of the pattern formed, the contour of the pattern formed, and the intensity of the light transmitted by the mask, Imax and Imin. These are but examples and the inventive concept is not limited to them.

Thus, the sensitivity matrix may be generated by measuring (quantifying) a plurality of optical functions, respectively, of the first and second masks M1 and M2 pattern by pattern, calculating the difference between the value of that optical function and the value of the same optical function of the mask M2 pattern by pattern, and arranging the calculations in a matrix.

Figure 4:
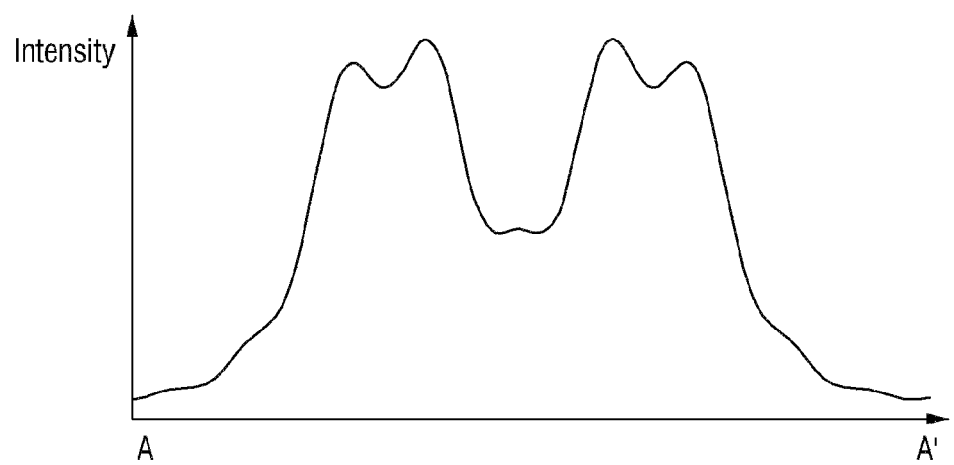
Figure 5:
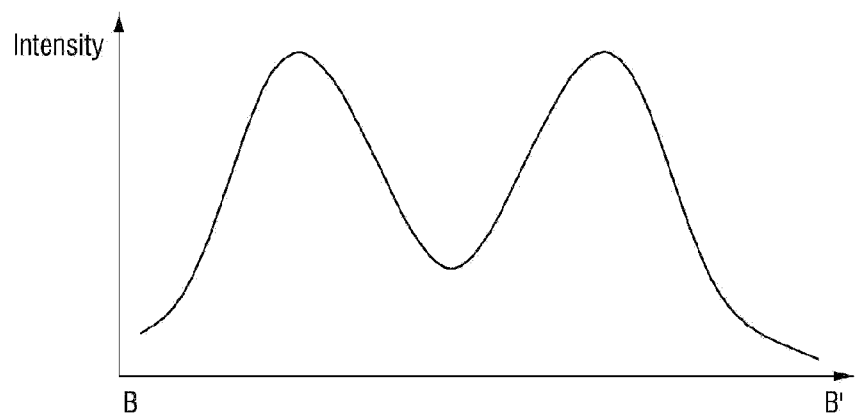

For example, the intensity of light transmitted from the first mask M1 along line A-A' in FIG. 2 (i.e., from one pattern) is illustrated in FIG. 4, and the intensity of light transmitted from the second mask M2 along line B-B' in FIG. 3 (i.e., from a corresponding pattern) is illustrated in FIG. 5. Referring to these FIGS. 4 and 5, it can be seen that the intensity of light changes as the shape of the pattern of the first mask M1, through which line A-A' passes, is geometrically altered by the predetermined bias ΔM. A value of this change may be referred to as an optical function difference.

An example of the sensitivity matrix S is shown below.

$$S = \begin{pmatrix} \vdots & \vdots & \vdots & \vdots & \vdots & \vdots \\ \frac{\partial CD_{sim}}{\partial M}, & \frac{\partial \|Contour\|_A}{\partial M}, & \frac{\partial Contrast}{\partial M}, & \frac{\partial I_{max}}{\partial M}, & \frac{\partial I_{min}}{\partial M}, & \frac{\partial Slope}{\partial M} & \cdots \\ \vdots & \vdots & \vdots & \vdots & \vdots & \vdots \end{pmatrix}_{G*P}$$

Here, each row of the sensitivity matrix S represents the optical function differences between a respective pair of the corresponding patterns of the masks M1 and M2. Each column of the sensitivity matrix S is thus a representation of variations in the optical function differences for a respective one of the optical functions. Thus, the columns represent the optical differences between masks M1 and M2 for each pair of corresponding first and second mask patterns.

In this example of the sensitivity matrix, the first column shows the variations of the changes in the critical dimensions (CD) of the patterns produced by in effect changing the mask patterns from the first patterns (patterns of the mask M1) to the second patterns (patterns of the second mask M2), the second column shows the variations in the contour, the third column shows the variations in contrast, the fourth column shows the variations in Imax, the fifth column shows the variations of the Imin, and the sixth column shows the variations in slope.

The sensitivity matrix S may have more columns than in the above-illustrated example because, as mentioned above, various other optical functions of a mask may change with changes in the geometry of the mask patterns by a predetermined bias ΔM. Also, the arrangement of the columns in the matrix S is not limited to that shown above.

Next, important ones of the functions among the optical functions in the sensitivity matrix S are selected (step S120). More specifically, the optical functions that make a significant impact on the mask performance or "sensitivity" are selected by analyzing (the values in) the sensitivity matrix S using statistics.

To this end, the sensitivity matrix S is normalized.

An example in which the sensitivity matrix S is transformed through singular value decomposition (SVD) is shown below.

$$S = U \cdot \begin{pmatrix} \sigma_1 & 0 & \vdots & 0 & 0 \\ 0 & \sigma_2 & \vdots & 0 & 0 \\ \vdots & \vdots & \vdots & \vdots & \vdots \\ 0 & 0 & \vdots & \sigma_{P-1} & 0 \\ 0 & 0 & \vdots & 0 & \sigma_P \\ \vdots & \vdots & \vdots & \vdots & \vdots \\ 0 & 0 & 0 & 0 & 0 \end{pmatrix}_{G*P} \cdot V^T$$

Accordingly, the rank of the sensitivity matrix S may be reduced. Then, the important optical functions are selected based on a comparison of the singular values $\sigma_1$ to $\sigma_P$ in the transformed sensitivity matrix S shown above.

For example, among the above-mentioned optical functions, i.e., critical dimension (CD), contrast, slope, contour, Imax, and Imin, the critical dimension (CD) and contrast are selected through this process as the important optical functions.

Then, the values of the optical function differences of the selected ("important") optical functions, i.e., data from those columns of the sensitivity matrix pertaining to the selected ("important") optical functions, are clustered (step S130).

Figure 6:
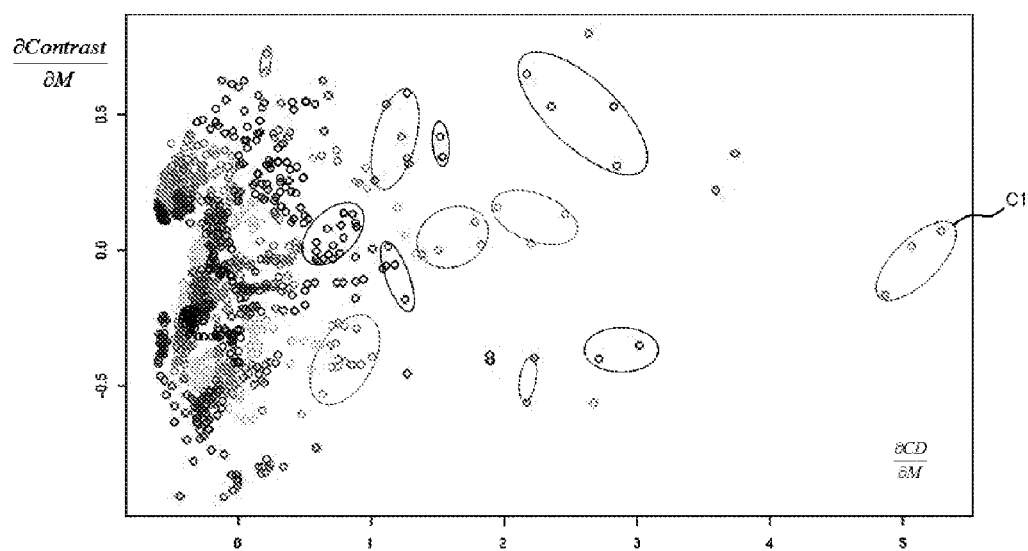

More specifically, for example as shown in FIG. 6, first, the values of the differences in optical function between corresponding patterns of the first and second masks M1 and M2 due to differences ΔM in the geometrical shapes of the corresponding patterns, for each of the selected optical functions (CD and contour in this example), are plotted in a sensitivity space. In the sensitivity space of FIG. 6, the values associated with the critical dimension (CD) are plotted along the X axis, and the values associated with the contrast are plotted along the Y axis. Only some of the very many (approximately millions of) data points that may be obtained this way are shown in FIG. 6.

The load of the system of data can be reduced while maintaining the accuracy of the OPC model if similar optical functions differences, as represented by adjacent points in the sensitivity space, are represented by only one data point. In this case, the corresponding pairs of mask patterns which show similar variations in the values of their optical function differences, with respect to the important optical functions of critical dimension (CD) and contrast, serve as a load in the system. Therefore, the clustering method clusters the similar values of the optical function (critical dimension (CD) and contrast) differences, and assigns to each cluster a value representative of the cluster.

To this end, various data clustering methods know per se may be used. That is, any well-known clustering method may be used as long as the between-cluster variation (spread among the values assigned to the clusters) is larger than the within-cluster variation (spread of values within each cluster). As an example, an iterative clustering process may be used.

In an example of this embodiment, a clustering of large application (CLARA) method is used. In this method, by using an objective cost function Q represented by the following equation, a representative value $m_j$ at a minimum of the objective cost function Q is assigned to each cluster $c_j$.

$$Q = \sum_{j=1}^{k} \sum_{x_i = c_j} \|x_i - m_j\|^2$$

Here, k is a designated number for each cluster, $x_i$ refers to an i-th point among the illustrated points, and $c_j$ refers to a j-th cluster of data represented by the value in $m_j$.

Thus, a large amount of data can be processed in a short period of time.

Figure 7:
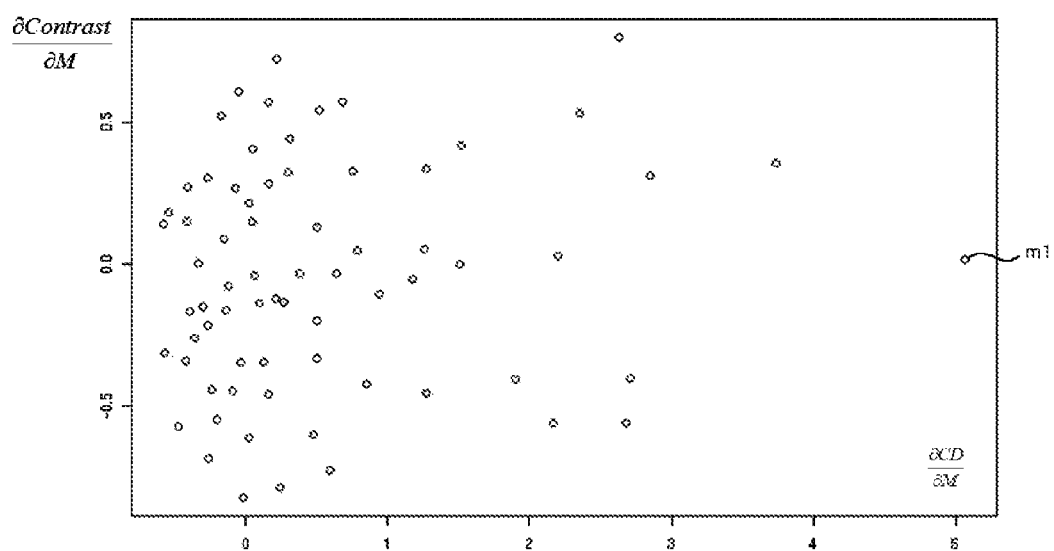

When the above-described clustering process is completed, the sensitivity space is simplified. In the example of this embodiment described above, sensitivity space shown FIG. 6 may wind up simplified as shown in FIG. 7. For example, a first cluster C1 of data points of the sensitivity space of FIG. 6 is represented by value m1 in FIG. 7. The representative values shown in FIG. 7 although minimal are capable of improving the accuracy (predictive power) of the OPC model. These representative values thus correspond to test patterns.

That is, referring back to FIG. 1, test patterns are selected among the first patterns by using the results of the clustering process (step S140). More specifically, the representative values shown in FIG. 7 are correlated with respective ones of the patterns of the first mask M1 from which the values were derived, and these first patterns are selected (designated) as the test patterns.

Then, OPC model calibration is performed (step S150). Specifically, the test patterns SEM are measured using a scanning electron microscope (SEM), and these measurements are used to calibrate an OPC model. Then a photomask subjected to OPC based on the calibrated OPC model, is fabricated. In general, mask patterns in the shape and arrangement of a desired circuit pattern to be formed are laid out, the geometry of the mask patterns is altered based on the calibrated OPC model thereby compensating for aspects of the lithographic process which would otherwise cause the pattern formed using the unaltered mask patterns in a lithographic process to differ from the desired circuit pattern. Because OPC models, and the calibrating of an OPC model using SEM measurements of a sample of mask patterns, are well known per se, the specifics of the OPC model calibration according to the inventive concept will not be described in detail for the sake of brevity.

However, an effect of the OPC model calibration, in accordance with the inventive concept, i.e., of determining which patterns from among all the patterns of the mask are to be used for OPC model calibration, will be described with reference to the graph of FIG. 8.

Figure 8:
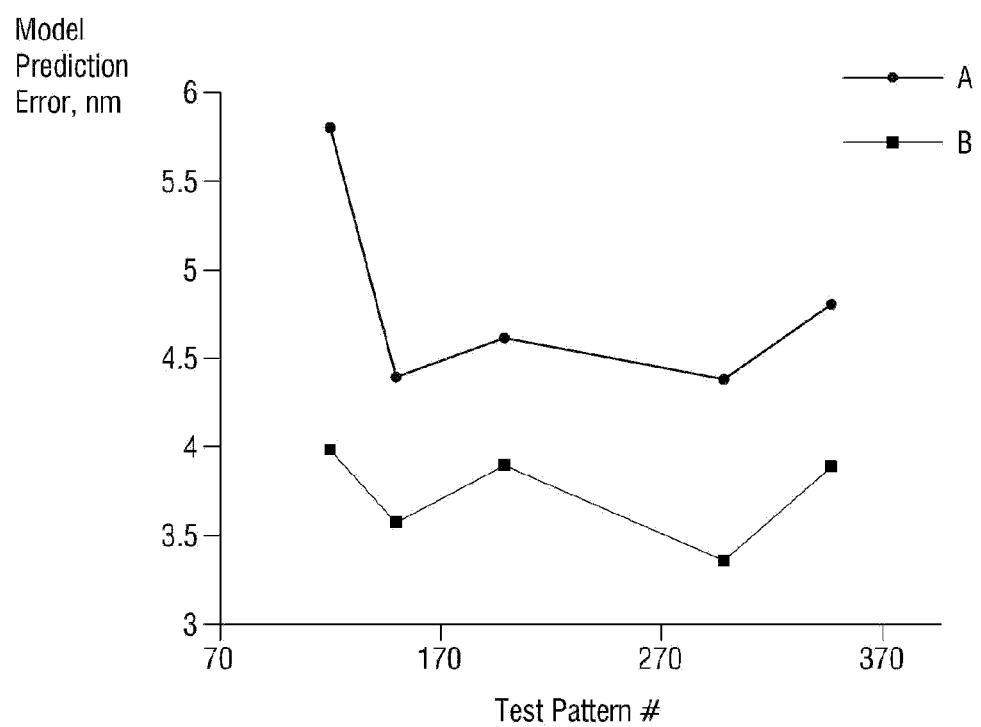
FIG. 8 is a graph of model prediction error based on the number of test patterns selected in a method according to the inventive concept and in a prior art method.

The graph of FIG. 8 illustrates differences in model prediction error with changes in the number of the test patterns. Here, A represents data obtained when an OPC model was calibrated based on measurements of test patterns selected using an image parameter space (IPS) technique, and B represents data obtained when the test patterns were selected according to the inventive concept.

Referring to FIG. 8, it can be seen that the model prediction error is smaller when the OPC model was calibrated according to the inventive concept, regardless of the number of the test patterns that wind up being selected. Furthermore, it can be seen that the range of model prediction errors (difference between maximum and minimum values) is also smaller according to the inventive concept.

Accordingly, it can be confirmed that the predictive power or accuracy of the OPC model calibrated in accordance with the inventive concept is improved.

Next, a pattern forming method in accordance with the inventive concept will be described with reference to FIGS. 9 to 11.

Figure 9:
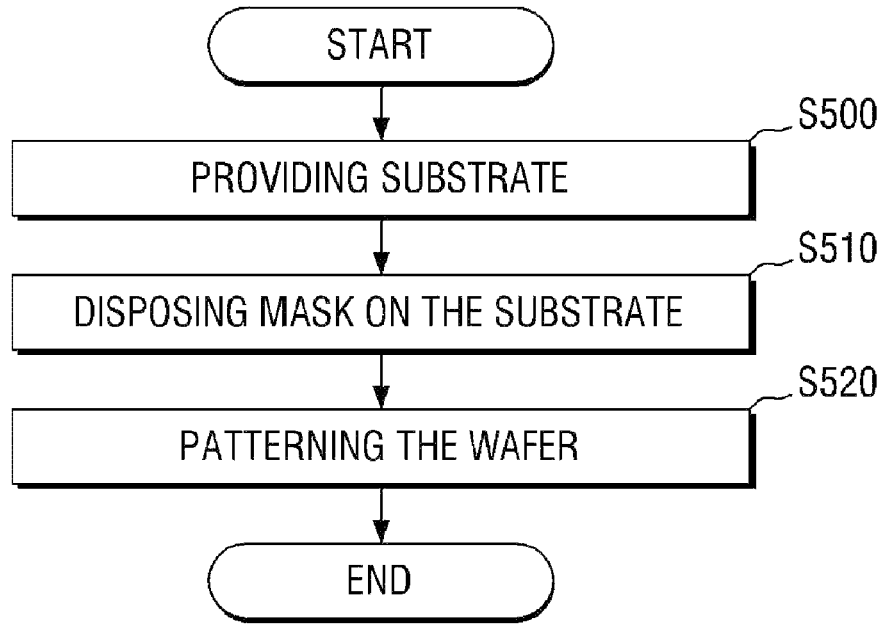
FIG. 9 is a flowchart of a lithographic method of forming patterns in accordance with inventive concept.
Figure 10:
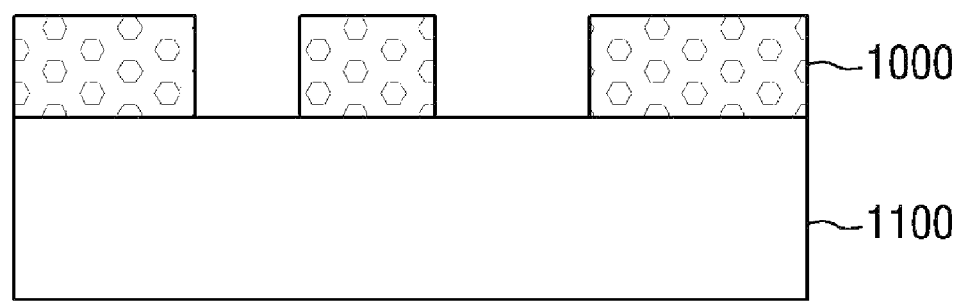
FIG. 10 is a sectional view of a wafer illustrating exposure and developing steps in the lithographic method.

Referring to FIGS. 9 and 10, a substrate 1100 is provided (step S500). In this example, the substrate 1100 is a semiconductor wafer on which a layer of photoresist has been formed. Then, a mask 1000 is formed on the substrate 1100 (step S510). In one example of this embodiment, the mask 1000 is formed by exposing and developing the photoresist layer, wherein the exposure process uses a photomask which has been designed and fabricated using OPC calibrated in the manner described above according to the inventive concept.

Figure 11:
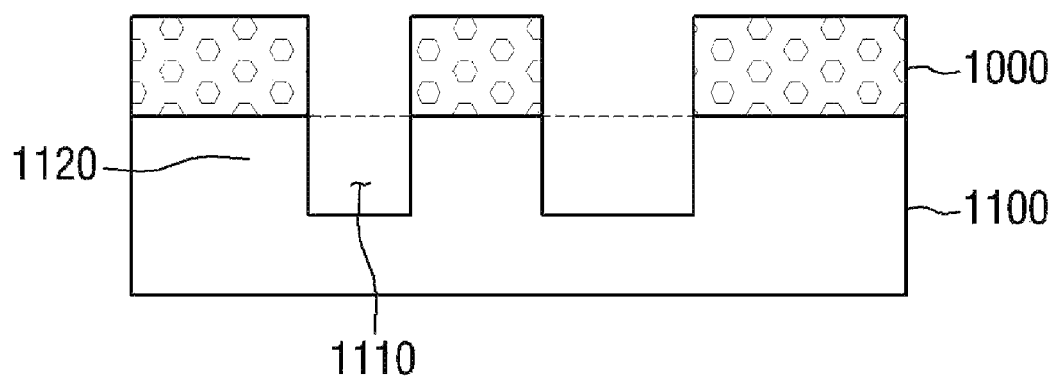
FIG. 11 is a sectional view of the wafer illustrating an etching step.

Then, referring to FIGS. 9 and 11, the substrate 1100 is patterned (step S520). Specifically, areas of the substrate 1100 are etched as illustrated using the mask 1000 disposed on the substrate 1100 as an etch mask, thereby forming trenches 1110 in the substrate 1100. Accordingly, a specific pattern 1120, as defined by the trenches 1110 formed in the substrate 1100, is transcribed to the substrate 1100.

Finally, an embodiment of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a photomask for use in lithography, comprising:
providing an OPC model;
calibrating the OPC model by:
quantifying several different optical functions of a first mask having first mask patterns, quantifying the same optical functions of a second mask having mask patterns that correspond to the first mask patterns, respectively, but differ from the first mask patterns by a predetermined bias, and calculating the differences between the optical functions, respectively, of the first and second masks,
wherein each of the optical functions is a respective type of result of a photolithography process using the mask and dependent on the geometry of the mask patterns of the mask, and
the quantifying of the optical functions of the first mask, the quantifying of the same optical functions of the second mask, and the calculating of the differences between the optical functions are preformed for each pair of corresponding patterns of the first and second masks,
generating a sensitivity matrix that includes data of values of the calculated differences in optical function for each of the optical functions, whereby the sensitivity matrix also contains data of variations among the values of the calculated differences for each of the optical functions,
analyzing the sensitivity matrix to select one or more optical functions from among said several different optical functions,
pulling data from the sensitivity matrix pertaining to the selected optical functions and clustering the data pulled from the sensitivity matrix, and
selecting respective ones of the first patterns in consideration of how the data clusters, and designating the selected first patterns as test patterns, whereby the first mask patterns are sampled; and
altering a layout of mask patterns of a photomask according to the calibrated OPC model, and fabricating the mask patterns according to the altered layout.

2. The method of claim 1, wherein the analyzing of the sensitivity matrix comprises applying singular value decomposition (SVD) to the values of the data in the sensitivity matrix.

3. The method of claim 2, further comprising normalizing the values of the data in the sensitivity matrix.

4. The method of claim 1, wherein the clustering of the data comprises:
plotting data of the variations among the values of the calculated differences for each of the optical functions, in a sensitivity space, and
assigning to each of clusters of the data in the sensitivity space one value representative of the data of the cluster.

5. The method of claim 4, wherein the assigning of values to the clusters comprises performing an iteration of the data in the sensitivity space.

6. The method of claim 4, wherein said clustering includes clustering of large application (CLARA).

7. The method of claim 1, wherein the optical functions include the critical dimension (CD) of a pattern that will be formed using the mask in a photolithography process, the contrast of an image of the mask pattern transmitted by the mask in the photolithography process, the slope of the sidewalls of the pattern formed, the contour of the pattern formed, and the intensity of the light transmitted by the mask.

8. The method of claim 7, wherein the sensitivity matrix includes data in the following matrix S:

$$S = \begin{pmatrix} \vdots & \vdots & \vdots & \vdots & \vdots & \vdots & \\ \frac{\partial CD_{sim}}{\partial M}, & \frac{\partial \|Contour\|_A}{\partial M}, & \frac{\partial Contrast}{\partial M}, & \frac{\partial I_{max}}{\partial M}, & \frac{\partial I_{min}}{\partial M}, & \frac{\partial Slope}{\partial M} & \cdots \\ \vdots & \vdots & \vdots & \vdots & \vdots & \vdots & \end{pmatrix}_{G*P}$$

wherein $CD_{sim}$ is the critical dimension of the patterns produced by a simulation of the photolithography process using the mask, Contour is a contour of patterns produced by the photolithography process using the mask, Contrast is the contrast of the image transmitted by the mask onto a focal plane of the photolithography process, $I_{max}$ is the maximum intensity of light transmitted by the mask in the photolithography process, $I_{min}$ is the minimum intensity of light transmitted by the mask in the photolithography process, and Slope is a slope of sidewalls of patterns produced by a photolithography process using the mask such that each row of the sensitivity matrix S consists of data representative of the optical function differences between a respective pair of the corresponding patterns of the first and second masks, and each column of the sensitivity matrix S consists of data representative of variations in the optical function differences for a respective one of the optical functions.

9. A method of fabricating a pattern on a substrate using the photomask fabricated according to the method of claim 1, wherein the method comprises forming a layer of photoresist on a target layer, exposing the layer of photoresist to an image of the mask patterns of the photomask, developing the layer of photoresist to form a photoresist pattern, and etching the target layer using the photoresist pattern as an etch mask.

10. The method of claim 1, wherein the sensitivity matrix includes data contained in a G*P matrix S, each row of the matrix S consisting of data representative of the difference in optical functions between a respective pair of the corresponding patterns of the first and second masks for each of a plurality of different ones of the optical functions, and each column of the matrix S consists of data representative of the optical function differences of a plurality of pairs of corresponding ones of the patterns of the first and second masks for a respective one of the optical functions.

11. A method of fabricating a photomask for use in lithography, comprising:
providing an OPC model;
calibrating the OPC model by:
laying out first mask patterns of a first mask,
laying out second mask patterns of a second mask by applying a bias to each of the first mask patterns such that each of the second mask patterns of the second mask has a corresponding first mask pattern that only differs from the second mask pattern by the second bias,
selecting a group of optical functions each being a respective type of result of a photolithography process using a mask and dependent on the geometry of a mask pattern of the mask,
quantifying each of the optical functions for each of the first mask patterns of the first mask, quantifying the same optical functions for each of the mask patterns of the second mask, and calculating the difference between the optical functions of the first and second mask patterns for each pair of corresponding ones of the first and second patterns whereby a plurality of values of optical differences between the first and second masks are calculated,
generating a sensitivity matrix that includes data of the values of the calculated differences in optical function for each of the optical functions, whereby the sensitivity matrix also contains data of variations among the values of the calculated differences for each of the optical functions,
analyzing the sensitivity matrix to select one or more optical functions from among said several different optical functions,
pulling data from the sensitivity matrix pertaining to the selected optical functions and clustering the data pulled from the sensitivity matrix, and
selecting respective ones of the first patterns in consideration of how the data clusters, and designating the selected first patterns as test patterns, whereby the first mask patterns are sampled; and
altering a layout of mask patterns of a photomask according to the calibrated OPC model, and fabricating the mask patterns according to the altered layout.

12. The method of claim 11, wherein the analyzing of the sensitivity matrix comprises applying singular value decomposition (SVD) to the values of the data in the sensitivity matrix.

13. The method of claim 12, further comprising normalizing the values of the data in the sensitivity matrix.

14. The method of claim 11, wherein the clustering of the data comprises:
plotting data of the variations among the values of the calculated differences for each of the optical functions, in a sensitivity space, and
assigning to each of clusters of the data in the sensitivity space one value representative of the data of the cluster.

15. The method of claim 14, wherein the assigning of values to the clusters comprises performing an iteration of the data in the sensitivity space.

16. The method of claim 14, wherein said clustering includes clustering of large application (CLARA).

17. The method of claim 11, wherein the optical functions include the critical dimension (CD) of a pattern that will be formed using the mask in a photolithography process, the contrast of an image of the mask pattern transmitted by the mask in the photolithography process, the slope of the sidewalls of the pattern formed, the contour of the pattern formed, and the intensity of the light transmitted by the mask.

18. A method of fabricating a pattern on a substrate using the photomask fabricated according to the method of claim 11, wherein the method comprises forming a layer of photoresist on a target layer, exposing the layer of photoresist to an image of the mask patterns of the photomask, developing the layer of photoresist to form a photoresist pattern, and etching the target layer using the photoresist pattern as an etch mask.

* * * * *